Figure 1:
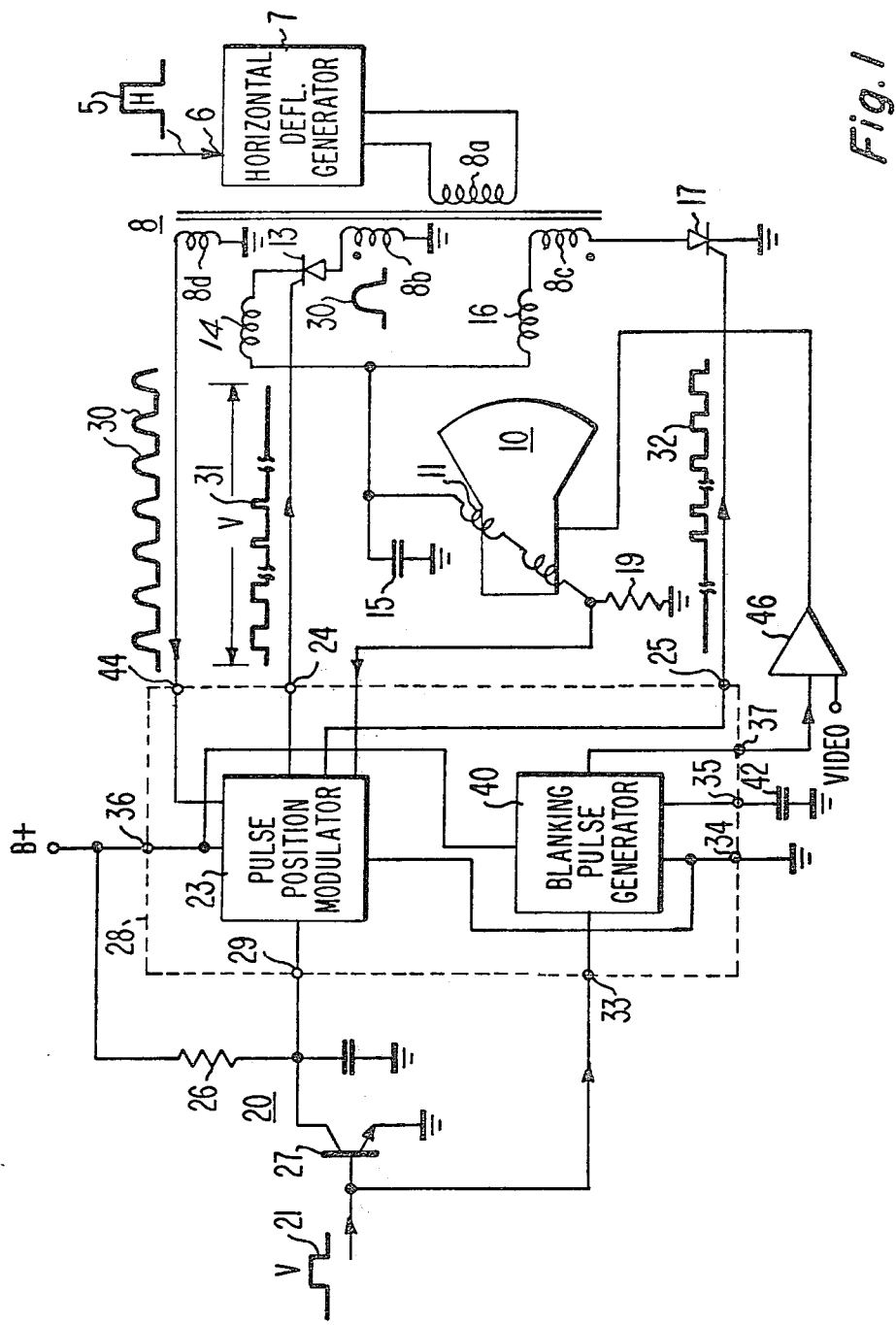

United States Patent [19]

Ahmed

[11] 4,134,046
[45] Jan. 9, 1979

[54] RETRACE BLANKING PULSE GENERATOR WITH DELAYED TRANSITION

[75] Inventor: Adel A. A. Ahmed, Annandale, N.J.

[73] Assignee: RCA Corporation, New York, N.Y.

[21] Appl. No.: 829,539

[22] Filed: Aug. 31, 1977

[51] Int. Cl.² ............................................ H01J 29/52
[52] U.S. Cl. .................................................. 315/384
[58] Field of Search ................. 315/384, 385, 386; 358/165

[56] References Cited

U.S. PATENT DOCUMENTS 3,931,545  1/1976  Marino .............................. 315/384

Primary Examiner—Theodore M. Blum
Attorney, Agent, or Firm—Eugene M. Whitacre; Paul J. Rasmussen; William H. Meise

[57] ABSTRACT

A delayed transition kinescope blanking pulse generator has a switch controlled by the deflection synchronizing pulses. The switch is coupled to a terminal of an energy storage means having a time constant. The switch changes the coupling of an energizing source to the energy storage means. A comparator coupled to the energy storage means and to a reference produces a blanking pulse having a transition the delay of which is determined by the time constant.

12 Claims, 10 Drawing Figures

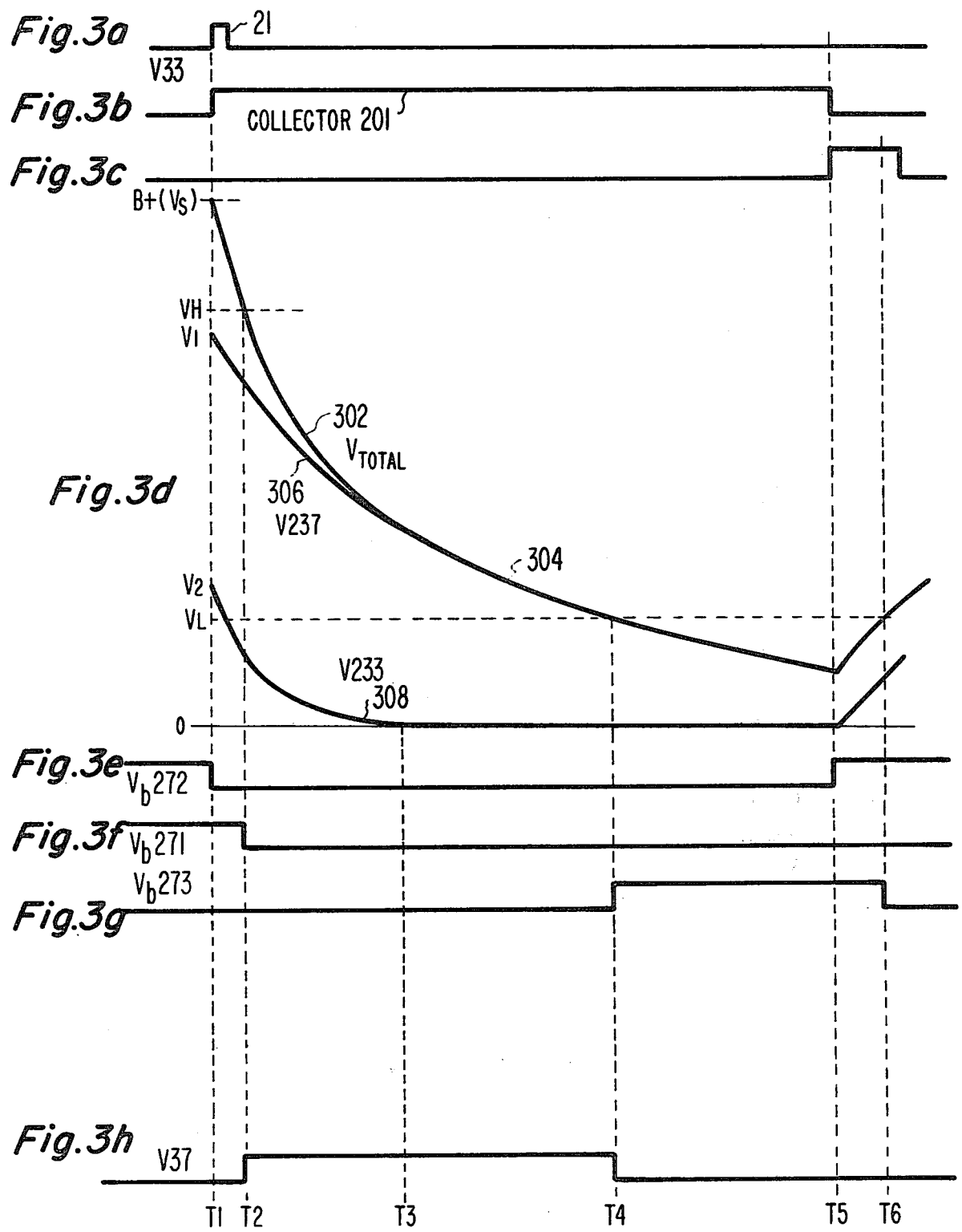

RETRACE BLANKING PULSE GENERATOR WITH DELAYED TRANSITION

BACKGROUND OF THE INVENTION

This invention relates to a blanking pulse generator useful in conjunction with television kinescope deflection circuits having inherent delay.

A switched synchronuus vertical deflection (SSVD) circuit is described in U.S. Pat. No. 4,048,544 issued Sept. 13, 1977 to Peter Eduard Haferl and entitled "SWITCHED VERTICAL DEFLECTION SYSTEM" in which energy is supplied to the vertical deflection winding on a kinescope by means of switched reactances coupled to the horizontal deflection generator. The switched reactances are controlled by a vertical sawtooth generator, the trace and retrace intervals of which are in turn controlled by the vertical synchronizing signals. A pulse position modulator driven by the sawtooth generator and synchronized with the horizontal retrace pulses generates switch gating signals which control the switched reactances in a manner to generate a sawtooth deflection current at the vertical rate in the vertical deflection winding. This arrangement has a low power consumption by comparison with other vertical deflection circuits and is considered commercially advantageous.

As is well known, it is very advantageous from the point of view of cost and reliability to include as many of the functions of a television receiver as possible within integrated circuits. Similarly, for standardization purposes it is highly desirable to produce integrated circuits in a fashion such that they are adapted for use with a wide variety of television receivers.

Since the low-power portions of a television receiver including a synchronous switched vertical deflection circuit according to the aforementioned U.S. Pat. No. 4,048,544 are relatively complex, an advantage in cost and reliability, as well as in serviceability, may be obtained by forming the pulse position modulator on an integrated circuit together with other ancillary circuits such as a blanking pulse generator. It has been discovered, however, that a switched synchronous vertical deflection system according to the aforementioned U.S. Pat. No. 4,048,544 has an inherent delay between the generated vertical sawtooth and the resulting vertical deflection current which depends upon the design of the deflection winding, which in turn depends upon the kinescope size and type. The magnitude of this delay has been observed to be in the range between 30 and 150 microseconds, and in special cases almost zero. The variation of the delay from receiver to receiver within each type, however, remains relatively constant. Consequently, in order to make it possible for a single control circuit to be used for a large variety of television yoke designs or kinescope sizes, means must be provided for delaying the generation of the transition defining initiation of the blanking pulse relative to the synchronizing pulse. The delay must be by an amount depending upon the delay of the vertical deflection circuit.

It is known from U.S. Pat. No. 3,931,545 issued on Jan. 6, 1976 to Francis C. Marino to allow the horizontal blanking interval to commence in coincidence with a horizontal synchronizing pulse but to delay the cutoff of the horizontal output transistor by a period of time equal to the entire horizontal sweep period less the transistor storage time by the use of multivibrators in tandem. This, however, is vulnerable to display distortion due to sweep jitter resulting from the regenerative nature of the multivibrators.

Furthermore, it is desirable to control the duration of the kinescope blanking pulse generated within the receiver so that portions of the vertical blanking interval not used for vertical retrace may be used for facsimile reproduction or other information transmission. However, as is well-known, the incorporation of large numbers of functions into integrated circuits places a premium upon the number of interface connections or terminals between the inside and outside of the integrated circuit. Thus, it is desirable to control both the delay occurring before initiation of the blanking pulse and its duration from a single interface terminal assigned exclusively for this purpose.

SUMMARY OF THE INVENTION

Figure 2:
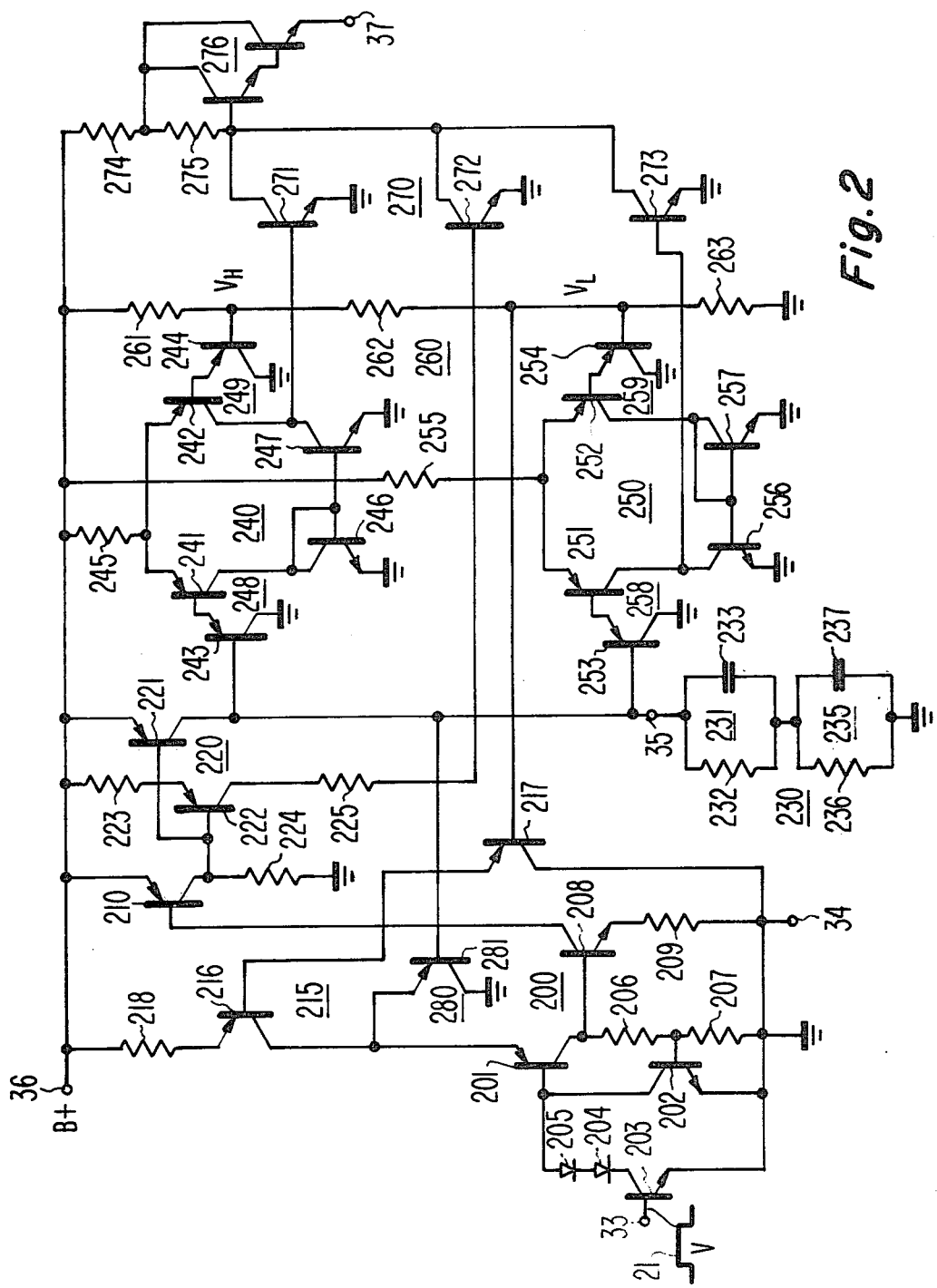

A delayed transition blanking pulse generator has a switch controlled by the deflection synchronizing pulses. The switch is coupled to a terminal of an energy storage means having a time constant. The switch changes the coupling of an energizing source to the energy storage means. A comparator coupled to the energy storage means and to a reference produces a blanking pulse transition, the delay of which relative to the synchronizing signal is determined by the time constant. The invention, its mode of operation and advantages will be more clearly understood by the following description and associated drawings of which:

FIG. 1 shows a vertical deflection circuit according to the aforementioned U.S. Patent Application Ser. No. 595,809 and embodying the invention;

FIG. 2 shows an embodiment of a blanking pulse generator suitable for use in conjunction with FIG. 1; and FIGS. 3a–3h show voltages associated with the blanking pulse generator of FIG. 2.

DESCRIPTION OF THE INVENTION

FIG. 1 shows, partially in block and partially in schematic form, the deflection and display portion of a television device. At the right of FIG. 1, a horizontal deflection generator 7 is synchronized by horizontal deflection pulses depicted as amplitude-time waveform 5 applied to an input terminal 6 from a synchronizing signal separator, not shown. Horizontal deflection generator 7 drives a horizontal deflection winding, not shown, associated with a kinescope 10. Horizontal deflection generator 7 also drives the primary 8a of a transformer 8. A secondary winding 8b of transformer 8, poled as shown, has one end connected to ground. The other end of secondary winding 8b couples recurrent positive-going horizontal retrace pulses depicted as pulse 30 to the anode of a thyristor or SCR 13, the cathode circuit of which includes a serial connection of an inductor 14 and integrating capacitor 15 coupled to ground. The end of a secondary winding 8c of transformer 8 at which a positive-going retrace pulse appears is coupled to ground by the anode-cathode path of a thyristor 17. The other end of winding 8c is coupled to capacitor 15 by an inductor 16. Capacitor 15 is coupled in parallel with the series combination of a current sensing feedback resistor 19 and a vertical deflection winding 11 which is disposed about the neck of kinescope 10.

A vertical sawtooth generator 20 at the left of FIG. 1 includes a capacitor 22 and a charging resistor 26 coupled between B+ and ground. A discharge switch transistor 27 has its collector-emitter path coupled across capacitor 22. The base of transistor 27 is driven by vertical synchronizing pulses 21 from the sync separator. A recurrent sawtooth voltage having relatively short retrace intervals synchronized with the vertical synchronizing signals appears as is known across capacitor 22.

The vertical sawtooth signals appearing across capacitor 22 are coupled by way of an interface terminal 29 to a pulse position modulator 23 intrinsic to an integrated circuit 28. Pulse position modulator 23 is coupled by an integrated circuit interface terminal 36 to a source B+ of energizing potential and by way of a common interface terminal 34 to ground. Modulator 23 produces thyristor gating pulses shown as voltage waveforms 31 and 32 at interface terminals 24 and 25, respectively, for application to the gates of thyristors 13 and 17, respectively. A winding 8d of transformer 8 produces horizontal retrace voltage pulses shown as waveforms 30 in response to operation of the horizontal deflection generator. Winding 8d is coupled to integrated circuit 28 at an interface terminal 44 for synchronizing the gating pulses produced by modulator 23.

While the operation of SSVD is described in detail in the aforementioned U.S. Pat. No. 4,048,544, a short description of the operation follows. The gating pulses are initiated at times during the horizontal retrace interval which, in the case of top-of-scan thyristor gating pulses 31, are progressively delayed with respect to the horizontal retrace pulse and, in the case of bottom-of-scan gating pulses 32, are initiated at times which are progressively advanced with respect to the horizontal retrace pulses. In operation during the first part of the vertical deflection interval, gating pulses 31 enable top-of-scan thyristor 13 for conduction during the initial portions of the horizontal retrace interval. As a result capacitor 15 charges in a resonant manner through inductor 14. The gating pulses cease before reversal of current in the resonant circuit including capacitor 15 and inductor 14, so that any tendency to reverse the current in thyristor 13 turns off until the next horizontal retrace interval again coincides with a gating pulse 31. As time progresses during the vertical deflection interval, gating pulses 31 occur later and later with respect to the horizontal retrace pulse, with a result that progressively less charging current flows in capacitor 15. Thus, progressively less voltage appears across vertical deflection winding 11 and the deflection current decreases.

Near the center of the vertical deflection interval, bottom-of-scan gating pulses 32 begin to occur at times near the end of the horizontal retrace pulses. Thus, bottom of-scan thyristor 17 is enabled for conduction near the end of the horizontal retrace interval, charging capacitor 15 through inductor 16 in a resonant manner with a polarity opposite to that of the top-of-scan thyristor. The progressively advancing time of initiation of gating pulses 32 during the second half of the vertical deflection interval progressively increases the negative charging current in capacitor 15, which results in an increasing negative voltage across vertical deflection winding 11 so as to deflect the kinescope beam progressively towards the bottom of the raster.

In addition to other circuits, integrated circuit 28 contains a blanking pulse generator 40 which is triggered by vertical synchronizing pulses 21 applied at an interface terminal 33. Blanking pulse generator 40 is energized by B+ and is coupled to common interface terminal 34. Blanking pulse generator 40 produces blanking pulses at a rate controlled by synchronizing pulses 21. The blanking pulses are coupled to the kinescope by an interface terminal 37 and a video amplifier 46. A capacitor 42 couples blanking pulse generator 40 to ground by way of an interface terminal 35. The time constant of capacitor 42, which is extrinsic to the integrated circuit, allows control of the time at which a transition of the blanking pulses produced by blanking pulse generator 40 takes place.

FIG. 2 shows in schematic form a blanking pulse generator which may be connected between interface terminals 33 through 37 of FIG. 1 as blanking pulse generator 40. Generally speaking, the arrangement of FIG. 2 shows at the left a vertical synchronizing pulse 21 applied to a latch circuit 200 energized by a constant-current source 215 at top left. The latch circuit energizes a switch 220 at left center of FIG. 2, which charges an energy storage means at bottom left of FIG. 2 and designated generally as 230. At center, comparators 240 and 250 compare the voltage across the energy storage means with reference voltages derived from a voltage divider 260. At the right of FIG. 2, a combining circuit designated generally as 270 combines outputs from the comparators and the switch to produce the desired kinescope blanking pulse at interface terminal 37 on the right of the FIGURE.

Vertical synchronizing pulses 21 are applied to the base of a transistor 203 of latch 200 by way of interface terminal 33. The emitter of transistor 203 is grounded and a serial connection of diodes 204 and 205 is coupled to the collector. The end of diode 205 remote from the collector of transistor 203 is connected to the collector of a transistor 202 and to the base of a transistor 201. The emitter of transistor 202 is grounded and its base is connected to the collector of transistor 201 in a regenerative manner by a tap on a voltage divider consisting of resistors 206 and 207 connected between the collector of transistor 201 and ground. An output signal is taken from the collector of transistor 201 by a pair of inverting stages including transistor 208 and resistor 209 connected from its emitter to ground, and transistor 210 having its base coupled to the collector of transistor 208 and its emitter connected to supply. Before the occurrence of a vertical synchronizing pulse, transistors 201, 202 and 203 are off or nonconducting. Consequently, transistors 208 and 210 are off.

Switch 220 includes a transistor 221 having its emitter connected to B+ and a transistor 222 having its emitter connected to B+ by a resistor 223. The bases of transistors 221 and 222 are connected to the collector of transistor 210 and receive biasing current from a resistor 224 connected to ground. Since transistor 210 is initially off, transistors 221 and 222 are initially conducting. The collector of transistor 222 is connected to the base of a transistor 272 of summing network 270 by way of a resistor 225. The emitter of transistor 272 is grounded. Since transistor 222 is normally conductive, transistor 272 is normally conductive.

The collector of transistor 221 is connected to extrinsic energy storage means 230 by way of interface terminal 35. Energy storage means 230 includes in series combination a first time-constant network designated generally as 235 and a second time-constant network designated as 231. Time-constant network 235 includes in parallel combination a capacitor 237 having one end connected to ground and a resistor 236. Time-constant network 231 similarly includes in parallel combination a capacitor 233 and a resistor 232. Since transistor 221 is initially on, capacitors 233 and 237 are fully charged.

Summing network 270 includes a transistor 271 having its emitter grounded and its collector connected to the collector of transistor 272. The base of transistor 271 acts as a further input to summing network 270. A third transistor 273 has its collector connected to the collector of transistor 272 and its emitter grounded, and the base of transistor 273 also acts as an input of summing network 270. The combined collectors of transistors 271 through 273 are connected to supply by means of the series combination of resistors 274 and 275. Darlington-connected output transistors are connected as an emitter-follower designated generally as 276 coupled between the combined collectors of transistors 271 through 273 and the output interface terminal 37. The collector of output emitter follower 276 is connected to the junction of resistors 274 and 275. With any of transistors 271 through 273 conductive, the output voltages are low and no blanking pulse occurs. Since transistors 272 and 271 are initially conductive, the normal output voltage condition at terminal 37 is low.

A reference voltage source designated generally as 260 includes resistors 261 through 263 coupled between B+ and ground. The voltage appearing at the junction of resistors 261 and 262 is designated as VH (high) and the voltage appearing at the junction of resistors 262 and 263 is designated as VL (low).

Comparator circuit 240 includes a differential amplifier consisting of emitter coupled transistors 241 and 242. The joined emitters of transistors 241 and 242 are coupled to B+ by means of a resistor 245. The base of the transistor 241 is connected to the emitter of a transistor 243, the collector of which is grounded. Transistor 242 has its base connected to the emitter of a transistor 244, the collector of which is grounded. Transistors 241 and 243 are arranged to form a compound or superalpha transistor designated generally as 248 and having as its effective base the base of transistor 243, as its emitter the emitter of transistor 241 and having the collector of transistor 241 as an output. Transistors 242 and 244 similarly form a superalpha configuration designated generally as 249. The collector of transistor 241 is connected to the anode of a diode-connected transistor 246, the cathode of which is grounded. A transistor 247 has its emitter grounded and its base connected to the base of transistor 246 thereby forming a current mirror. The collector of transistor 247 is coupled to the collector of transistor 244 to form an output of comparator 240, which is connected to a base of transistor 271. The base of transistor 243 is connected to the collector of transistor 221. The base of transistor 244 is connected to reference voltage VH. Since the initial condition of transistor 221 is fully conducting, the base of transistor 243 is substantially more positive than reference voltage VH. Consequently, superalpha transistor 249 is conductive and 248 nonconductive, and current mirror transistors 246 and 247 are also nonconducting. The output voltage of comparator 240 under this condition is high, so that the output voltage of summing network 270 is also held low by transistor 271.

Comparator 250 is similar in all respects to comparator 240, except that the output is inverted in amplitude by comparison with comparator 240. In short, comparator 250 includes emitter coupled superalpha transistors designated as 258 and 259, consisting of transistors 251 and 253, and 252 and 254, respectively. An emitter resistor 255 couples the joined emitters to B+. The base of transistor 258 is coupled to the collector of transistor 221, and the base of transistor 259 is coupled to reference voltage VL. The collector of transistor 259 drives a current mirror consisting of a diode-connected transistor 257 and a transistor 256, the collector of which is coupled to the collector of transistor 258, thereby forming an output junction of comparator 250. The output of comparator 250 is coupled to the base of transistor 273. The input of transistor 258 is coupled to the collector of transistor 221 which is initially conductive, but unlike comparator 240, the output voltage of comparator 250 is low. Consequently, transistor 273 is off.

An unlatching circuit designated generally as 280 includes a transistor 281 having its emitter connected to the emitter of transistor 201 and its collector connected to ground. The base of transistor 281 is connected to the collector of transistor 221. Initially, since transistor 221 is on and since the potential of the collector of transistor 221 is high, transistor 281 is off. The current source designated generally as 215 includes an emitter follower transistor 217 having its base connected to reference voltage source VL and its emitter connected to the base of a transistor 216. Transistor 216 has its emitter coupled to supply by means of a resistor 218. So long as transistor 216 is in its active region, its collector current is determined by the voltage appearing across resistor 218 which in turn is determined by reference voltage VL. However, with transistors 201 and 281 nonconducting, transistors 216 is initially saturated and produces no useful collector current.

Upon the occurrence of a synchronizing signal such as 21 defining the initiation of the retrace blanking pulse cycle, transistor 203 is turned on and transistor 201 has its base returned to ground. Transistor 201 is thereby rendered conductive, and transistor 216 begins supplying a constant current through transistor 201, resistors 206 and 207 to ground. FIG. 3a depicts a synchronizing pulse 21 and FIG. 3b the collector voltage of transistor 201. Transistor 202 is rendered conductive by forward base-emitter bias appearing across resistor 207 and latches transistor 201 in the conductive state. Transistor 201 is thereafter not responsive to changes in the conduction state of transistor 203. With transistors 201 and 202 conductive, base current is supplied to transistors 208 and 210, which turn on. Conduction of transistor 210 bypasses the bias current supplied by resistor 224 away from transistors 221 and 222, which thereupon become nonconductive. Nonconduction of transistor 222 removes bias current from transistor 272 in summing network 270, rendering transistor 272 nonconductive, as shown in FIG. 3e.

At the instant that transistor 221 becomes nonconductive, interface terminal 35 is essentially at the supply voltage B+. Capacitor 233 is charged to a voltage V2 equal to the voltage appearing across resistor 232 as part of a voltage divider including resistors 232 and 236. Similarly, capacitor 237 is charged to a voltage V1 equal to the difference between the supply voltage and voltage appearing across capacitor 233. When switch 221 opens, each of capacitors 233 and 237 begins to discharge through its respective parallel-coupled resistor in a manner substantially independent of the other capacitor. The voltage VTOTAL at interface terminal 35 is at all times equal to the sum of the voltages across the capacitors.

In FIG. 3d the total voltage across both capacitors is shown by the approximately exponential curve sections designated 302 and 304. Total voltage curves 302 and 304 represent the sum of the instantaneous voltage V237 appearing across capacitor 237, represented by curve sections 304 and 306, with the instantaneous voltage V233 appearing across capacitor 233 and represented by curve 308. It can be seen that the time constant t1 of capacitor 233 with resistor 232 is short by comparison with the time constant t2 of capacitor 237 and resistor 236.

The sum 302 of the instantaneous voltages across the timing capacitors drops below reference voltage VH at a time T2. At this time, comparator 240 will switch and its output to transistor 271 will go low, as shown in FIG. 3f, whereupon transistors 271 through 273 will be nonconductive and a first transition will occur at output terminal 37, defining the leading edge of the retrace blanking pulse as shown in FIG. 3h.

Capacitors 233 and 237 will continue to discharge. At some time such as T3 the voltage remaining across capacitor 233 becomes insignificant by comparison with the voltage across capacitor 237, so the sum of the voltages across capacitors 233 and 237 equals the voltage across capacitor 237 alone, as shown by curve section 304 of FIG. 3d. The discharge of capacitor 237 through resistor 236 continues as shown by curve 304.

At some later time, such as at T4, sum voltage 304 equals reference voltage VL. At this time comparator 250 changes state, and the base voltage of transistor 273 goes high, as shown by FIG. 3g. This in turn causes a second transition defining the lagging edge of the blanking pulse, as shown in FIG. 3h. Capacitor 237 continues to discharge after time T4. At a later time, such as T5 of FIG. 3, sum voltage 304 at terminal 35 will equal the base voltage of transistor 201. Prior to this time, synchronizing signal 21 will have terminated. Transistor 281 will divert operating current away from and unlatch transistor 201, causing transistors 201, 202, 208 and 210 to become nonconductive. This causes transistors 221 and 222 to become conductive. Transistor 222 causes transistor 272 in the summing network to turn on, thereby assuring that the output of summing network 270 remains low during return of the circuit to the initial state. Conduction of transistor 221 causes capacitors 233 and 237 to begin to recharge towards their initial values, as is shown in FIGS. 3d at times after T5.

At some time such as T6, sum voltage 304 again equals reference voltage VL, whereupon comparator 250 and transistor 273 assume their initial state, as shown at FIG. 3g. At a slightly higher sum voltage, transistor 281 becomes nonconductive as transistor 216 of current source 215 goes into saturation. FIG. 3c shows the conductive state of transistor 281. At a still later time, not shown, as capacitors 233 and 237 charge back towards their initial state, comparator 240 and transistor 271 also return to their initial states. The cycle is completed when capacitors 233 and 237 are fully charged.

Adjustments for design purposes can be made by introducing voltage offsets in the form of diodes in the emitter circuits of transistors 201 and 281 and/or by changing the ratio of the resistances of resistors 206 and 207. The voltage at the base of transistor 201 in the latched condition of transistors 201 and 202 must exceed the lowest level reached by the base of transistor 281 towards the end of the discharge cycle.

No special relationship need exist between the ratio of resistors 232 and 236 and the ratios of the resistors of reference voltage divider 260. However, since only resistors 232 and 236 are externally accessible, greater range of adjustment are available with certain ratios of resistance than with others, particularly if practical constraints on voltage ranges are taken into account. Suitable values for the resistances can be found by carrying out calculations for a range in values and selecting those producing favorable conditions. Rigorous calculations involve transcendental equations and are laborious.

Considerable simplification of the calculations results when VH is made equal to V1, the initial voltage across capacitor 237. While achieving a simplification of the calculations, this does not introduce a permanent design restriction since extrinsic resistors 232 and 236 may be selected to produce some other value of V1. A further simplification results from the fact that the time constant t1 of capacitor 233 with resistors 232 is much smaller than the time constant t2 of capacitor 237 with resistor 236. This results in there being an effect of t1 and t2 on the initial delay between initiation of the blanking delay cycle at time T1 and initiation of the kinescope blanking pulse at T2. However, there is no corresponding effect of t1 on the delay between time T1 and the end of the kinescope blanking pulse at time T4, control being practically exclusively in t2. Thus, time constant T2 can be calculated based upon known time T4, followed by a calculation of t1.

As an example of such a simplified calculation, component values and relationships are calculated for an initial delay time T1-T2 of 100 microseconds and a blanking time T2-T4 of 0.9 milliseconds.

Referring to FIG. 3d, set $$V_1 = V_H \qquad (1)$$

$$V_2 = V_L \qquad (2)$$

and assign $V_1$ as 80% of supply voltage B+ and $V_2$ as 20%;

$$V_1 = 0.8 \, V_S \qquad (3)$$

$$V_2 = 0.2 \, V_S \qquad (4)$$

Then $$V_{233} = (V_S - V_1) \, e^{-t/t_1} \qquad (5)$$

and $$V_{237} = (V_1) \, e^{-t/t_2} \qquad (6)$$

Assuming that the effect on $t_2$ of $t_1$ is negligible, calculate $t_2$;

$$V_{237} = 0.8 \, V_S \, e^{-t/t_2} \qquad (7)$$

and, since $V_{237}$ equals $V_L$ at time $t_4$, $$V_{237} = 0.2 \, V_S = 0.8 \, V_S \, e^{-t_4/t_2} \qquad (8)$$

or $$0.2 = 0.8 \, e^{-0.001 \, sec/t_2} \qquad (9)$$

and $$t_2 = 0.001/\ln 4 = 7.2135 \, (10^{-4}) \, \text{sec} \qquad (10)$$

Referring again to FIG. 3d in order to calculate $t_1$, time $T_1$ will occur when $V_{233}$ has decreased to a voltage equal to that by which $V_{237}$ has decreased, therefore at $T_1$ $$V_{233} = V_2 e^{-t_1/t_1} = (V_S - V_1) e^{-t_1/t_1} = V_1 - V_{237} \quad (11)$$

where $$V_{237} = V_1 e^{-T_1/t_2} \quad (12)$$

hence $$0.2 \, V_S e^{-t_1/t_1} = 0.8 \, V_S - 0.8 \, V_S e^{-T_1/t_2} \quad (13)$$

or $$e^{-(100 \, \mu sec/t_1)} = 4 - 4 e^{-(100 \, \mu sec/t_2)} \quad (14)$$

from which $$t_1 = 100 \, \mu sec/\ln [4 - 4 \, e^{-10-4/7.2135(10-4)}] \quad (15)$$

and $$t_1 = 1.5194 \, (10^{-4}) \, sec \quad (16)$$

If resistor 236 is assigned a value of approximately 80 kilohms based upon other considerations, then $$C_{237} = t_2/R_{236} = 9(10^{-9}) \text{farad} \quad (17)$$

A practical value for capacitor 237 is then 0.01µfd, whereupon resistor 236 must be 72 kilohms. Resistor 232 must therefore be 20% of the total or 18 kilohms. From this, $$C_{233} = t_1/18k = 8440 \text{ picofarads} \quad (18)$$

It is advantageous to keep resistor 232 relatively small so as to allow a relatively short time for recharging of capacitors 233 and 237 to their initial values. To obtain other values of blanking pulse duration or delay the ratio of extrinsic resistors 232 and 236 may be maintained as calculated above in order to facilitate calculations. Adjustment of the magnitudes of the timing capacitors can then be selected to provide the different delays between transitions. It should particularly be noted that the selection of the timing components can proceed without regard for the magnitude of the supply voltage.

Other arrangements within the scope of the invention will be apparent to those skilled in the art. For example, while extrinsic time constant network 231 allows a convenient control of the delay between the synchronizing pulse and the initiation of the blanking pulse, it is apparent that a single time constant network such as 235 could be used alone. Furthermore, a single time constant network can be coupled in series with a reference voltage between interface terminal 35 and ground to provide adjustment in the time of occurrence of blanking pulse transitions.

Also, the switch may be arranged to charge the integrated storage means during the timing interval, rather than allowing discharge. Similarly, if the internal leakage of the timing capacitors is suitable, discharge resistors 232 and 236 may be modified in value or eliminated completely.

What is claimed is:

1. A retrace blanking pulse generator for a television receiver including a kinescope deflection apparatus synchronized from a source of synchronizing signals initiating but preceding a blanking pulse transition, comprising:

a source of operating power;
   energy storage means including means for forming a time constant;
   switch means, coupled to the source of synchronizing signals, to said source of operating power and to said energy storage means for switching the coupling of said energy storage means to said source of operating power in synchronism with said synchronizing signals;
   a source of reference potential;
   comparator means having a first input coupled to said source of reference potential and a second input coupled to said energy storage means, said comparator being coupled to the output of said blanking pulse generator at which said blanking pulse transition is initiated at a time after said synchronizing signal determined by said time constant.

2. A retrace blanking pulse generator in accordance with claim 1 wherein said blanking pulse transition is the leading edge of said blanking pulse.

3. A retrace blanking pulse generator in accordance with claim 1 wherein said blanking pulse transition is the lagging edge of said blanking pulse.

4. A blanking pulse generator for a television receiver according to claim 1 wherein:

said blanking pulse generator further comprises a second source of reference potential;
   and further comprising second comparator means coupled to said energy storage means and to said second source of reference potential, said second comparator means being inverting with respect to said first comparator means; and
   summing means coupled between said output of said blanking gnerator and the outputs of said first and second comparator means for generating the blanking pulse by summing the outputs of said first and second comparator means, the duration of said blanking pulse being established by the time required for a change in the energy stored in said energy storage means between limits set by said first and second comparator means.

5. A blanking pulse generator in accordance with claim 4 wherein said switch means further couples a voltage derived from said source of operating potential to a third input of said summing means during that interval in which said energy storage means has its initial energy state restored preparatory to timing the succeeding pulse for preventing occurrence of an output from said blanking pulse generator during said restoration interval.

6. A blanking pulse generator for a television receiver according to claim 1 further comprising:

latching means having first and second stable states, said latching means including an input and an output and being interposed between said source of synchronizing signals and said switch means, said latching means being adapted to switch from said first stable state to said second stable state upon application of said synchronizing signal to said input terminal and to maintain said second state after the termination of said synchronizing signal; and
   feedback unlatching means coupled to said energy storage means and to a second input of said latching means for switching said latching means back to said first state after completion of said blanking pulse.

7. A blanking pulse generator for a television receiver according to claim 6 further comprising:
 a current source for producing a current flow for load voltages within a first range and for producing substantially no voltage for load voltages within a second range of load voltages; and
 means coupling said current source to said latching means for supporting said second stable state of said latching means and for deenergizing said latching means upon operation of said feedback unlatching means.

8. A blanking pulse generator for a television receiver according to claim 7 wherein:
 said latching means comprises first and second latching transistors of opposite conductivity types each having a collector electrode connected to the base electrode of the other, and having their respective emitters serially coupled to opposite terminals of the source of energizing potential by way of said current source;
 and said feedback unlatching means comprises a feedback unlatching transistor coupled in parallel with said first and second latching transistors in such a manner as to bypass current from said current source away from said latching transistors when said feedback unlatching transistor is conductive.

9. A blanking pulse generator for a television receiver according to claim 8 further comprising:
 latch input coupling means coupled to said source of synchronizing signals and to the base of said latching transistor for initiating latching, and
 voltage offset means coupled to said latch means for maintaining the voltage at the junction of said feedback unlatching means and said latching means at a value in excess of the lowest voltage appearing across said energy storage means during the operating interval.

10. A blanking pulse generator in accordance with claim 1 wherein said energy storage means further comprises second means for forming a time constant having a second time constant of greater duration than said first time constant and coupled in circuit with said first time constant;
 a second source of a reference potential;
 second comparator means coupled to said first and second means for forming a time constant and to said second source of reference potential, said second comparator means being inverting with respect to said first comparator means; and
 summing means coupled between said output of said blanking generator and to the outputs of said first and second comparator means, the time delay between said synchronizing signal and commencement of said blanking pulse being controlled by said first time constant in conjunction with said second time constant, and the duration of said blanking pulse being determined substantially by said second time constant.

11. A delayed blanking pulse generator adapted for use in conjunction with an integrated circuit of a type adapted for common use in a variety of television receiver types having differing kinescope and yoke designs which change the inherent delay between the vertical synchronizing pulse and commencement of retrace from design to design;
 said blanking pulse generator comprising;
 energy storage means extrinsic to the integrated circuit and having a time constant selected to provide a delay of the blanking pulse relative to the vertical synchronizing pulse appropriate to the television receiver type;
 switching means intrinsic to said integrated circuit adapted to changing the coupling of said energy storage means to an energizing source and for generating said blanking pulse when a particular first amount of energy is stored in said energy storage means and terminating said blanking pulse when a particular second amount of energy is stored in said energy storage means; and wherein
 said energy storage means is coupled to said integrated circuit at first and second interface terminals.

12. A delayed blanking pulse generator in accordance with claim 11 wherein said first interface terminal is a common terminal.

* * * * *